(12) United States Patent
Chen et al.

(10) Patent No.: US 10,269,763 B2
(45) Date of Patent: Apr. 23, 2019

(54) PACKAGE-ON-PACKAGE STRUCTURE HAVING POLYMER-BASED MATERIAL FOR WARPAGE CONTROL

(71) Applicant: Taiwan Semiconductor Manufacturing Co., Ltd., Hsin-Chu (TW)

(72) Inventors: Meng-Tse Chen, Changzhi Township (TW); Yu-Chih Liu, Taipei (TW); Hui-Min Huang, Taoyuan (TW); Wei-Hung Lin, Xinfeng Township (TW); Jing Ruei Lu, Taipei (TW); Ming-Da Cheng, Jhubei (TW); Chung-Shi Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 8 days.

(21) Appl. No.: 15/461,796

(22) Filed: Mar. 17, 2017

(65) Prior Publication Data

US 2017/0194289 A1    Jul. 6, 2017

Related U.S. Application Data

(63) Continuation of application No. 15/143,892, filed on May 2, 2016, now Pat. No. 9,627,355, which is a (Continued)

(51) Int. Cl.
*H01L 25/065* (2006.01)
*H01L 23/29* (2006.01)
(Continued)

(52) U.S. Cl.
CPC ........ *H01L 25/0652* (2013.01); *H01L 21/561* (2013.01); *H01L 21/563* (2013.01);
(Continued)

(58) Field of Classification Search
None
See application file for complete search history.

(56) References Cited

U.S. PATENT DOCUMENTS 6,225,704 B1   5/2001  Sumita et al.
6,404,062 B1 * 6/2002  Taniguchi ............. H01L 21/563
                                                   257/686
(Continued)

OTHER PUBLICATIONS

Non-Final Office Action dated Jul. 8, 2013 for U.S. Appl. No. 13/539,136.
(Continued)

*Primary Examiner* — Hoang-Quan T Ho
(74) *Attorney, Agent, or Firm* — Eschweiler & Potashnik, LLC

(57) ABSTRACT

The present disclosure relates to a package-on-package structure providing mechanical strength and warpage control. In some embodiments, the package-on-package structure includes a first set of conductive elements coupling a first package component to a second package component. A first molding material is arranged on the first package component. The first molding material surrounds the first set of conductive elements and outer sidewalls of the second package component and has a top surface below a top surface of the second package component. The stacked integrated chip structure further includes a second set of conductive elements that couples the second package component to a third package component.

20 Claims, 3 Drawing Sheets

Related U.S. Application Data continuation of application No. 13/539,136, filed on Jun. 29, 2012, now Pat. No. 9,349,663.

(51) Int. Cl.
  *H01L 23/00* (2006.01)
  *H01L 25/00* (2006.01)
  *H01L 23/31* (2006.01)
  *H01L 21/56* (2006.01)

(52) U.S. Cl.
  CPC ............ *H01L 23/00* (2013.01); *H01L 23/293* (2013.01); *H01L 23/3121* (2013.01); *H01L 23/562* (2013.01); *H01L 24/17* (2013.01); *H01L 25/0655* (2013.01); *H01L 25/50* (2013.01); *H01L 2224/16* (2013.01); *H01L 2224/32225* (2013.01); *H01L 2224/73204* (2013.01); *H01L 2224/92125* (2013.01); *H01L 2225/06513* (2013.01); *H01L 2225/06517* (2013.01); *H01L 2225/06555* (2013.01); *H01L 2225/06582* (2013.01); *H01L 2924/15311* (2013.01)

(56) References Cited

U.S. PATENT DOCUMENTS

| | | | |
|---|---|---|---|
| 6,448,665 B1 | 9/2002 | Nakazawa et al. | |
| 6,548,330 B1 | 4/2003 | Murayama et al. | |
| 6,727,583 B2 | 4/2004 | Naka | |
| 6,774,467 B2 | 8/2004 | Horiuchi et al. | |
| 6,794,273 B2 | 9/2004 | Saito et al. | |
| 6,853,064 B2 | 2/2005 | Bolken et al. | |
| 6,870,248 B1 | 3/2005 | Shibata | |
| 7,071,028 B2 | 7/2006 | Koike et al. | |
| 7,138,706 B2 | 11/2006 | Arai | |
| 7,187,070 B2 | 3/2007 | Chu et al. | |
| 7,294,533 B2 | 11/2007 | Lebonheur | |
| 7,335,994 B2 | 2/2008 | Klein et al. | |
| 7,339,264 B2 | 3/2008 | Shibata | |
| 7,388,294 B2 | 6/2008 | Klein et al. | |
| 7,432,600 B2 | 10/2008 | Klein et al. | |
| 7,556,983 B2 | 7/2009 | Kurita | |
| 7,622,801 B2 | 11/2009 | Kurita | |
| 7,754,534 B2 | 7/2010 | Saito et al. | |
| 7,777,351 B1 | 8/2010 | Berry et al. | |
| 7,843,052 B1 | 11/2010 | Yoo et al. | |
| 8,405,228 B2 | 3/2013 | Huang | |
| 8,723,310 B2 | 5/2014 | Park | |
| 2002/0074637 A1 | 6/2002 | McFarland | |
| 2003/0141582 A1 | 7/2003 | Yang et al. | |
| 2003/0219969 A1* | 11/2003 | Saito | H01L 21/4857 438/622 |
| 2004/0036164 A1 | 2/2004 | Koike et al. | |
| 2004/0150081 A1 | 8/2004 | Ogawa | |
| 2004/0253803 A1 | 12/2004 | Tomono et al. | |
| 2004/0262776 A1 | 12/2004 | Lebonheur | |
| 2006/0237833 A1 | 10/2006 | Klein et al. | |
| 2008/0251913 A1 | 10/2008 | Inomata | |
| 2009/0152700 A1 | 6/2009 | Kuan et al. | |
| 2011/0024888 A1 | 2/2011 | Pagaila et al. | |
| 2011/0285007 A1 | 11/2011 | Chi et al. | |
| 2012/0171814 A1 | 7/2012 | Choi et al. | |
| 2012/0193779 A1 | 8/2012 | Lee et al. | |
| 2012/0211885 A1* | 8/2012 | Choi | H01L 23/3128 257/737 |
| 2012/0267782 A1 | 10/2012 | Chen | |
| 2012/0299197 A1 | 11/2012 | Kwon et al. | |
| 2013/0334714 A1 | 12/2013 | Park | |

OTHER PUBLICATIONS

Final Office Action dated Jan. 22, 2014 for U.S. Appl. No. 13/539,136.
Non-Final Office Action dated Oct. 24, 2014 for U.S. Appl. No. 13/539,136.
Final Office Action dated Jun. 4, 2015 for U.S. Appl. No. 13/539,136.
Notice of Allowance dated Jan. 20, 2016 for U.S. Appl. No. 13/539,136.
Non-Final Office Action dated Jun. 27, 2016 for U.S. Appl. No. 15/143,892.
Notice of Allowance dated Dec. 5, 2016 for U.S. Appl. No. 15/143,892.

* cited by examiner

PACKAGE-ON-PACKAGE STRUCTURE HAVING POLYMER-BASED MATERIAL FOR WARPAGE CONTROL

REFERENCE TO RELATED APPLICATION

This Application is a Continuation of U.S. patent application Ser. No. 15/143,892 filed on May 2, 2016, which is a Continuation of U.S. patent application Ser. No. 13/539, 136 filed on Jun. 29, 2012 (now U.S. Pat. No. 9,349,663 issued on May 24, 2016), the contents of which are hereby incorporated by reference in their entirety.

BACKGROUND

Package-on-package (PoP) is becoming an increasingly popular integrated circuit packaging technique because PoP allows for higher density electronics.

In a conventional package-on-package process, a first package component such as an interposer is mounted onto a second package component such as a package substrate. A semiconductor chip may be mounted on the interposer using flip-chip bonding. An underfill may be dispensed into the gap between the semiconductor chip and the interposer to prevent cracks from being formed in solder bumps or solder balls. Cracks are typically caused by thermal stress and warpage. The thermal stress and warpage are caused by thermal expansion mismatch between the components of a package-on-package structure. Even with the use of underfills and interposers, the problem of warpage still cannot be entirely eliminated.

BRIEF DESCRIPTION OF DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Various steps in the formation of package-on-package will be described with reference to FIGS. 2 through 5c. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
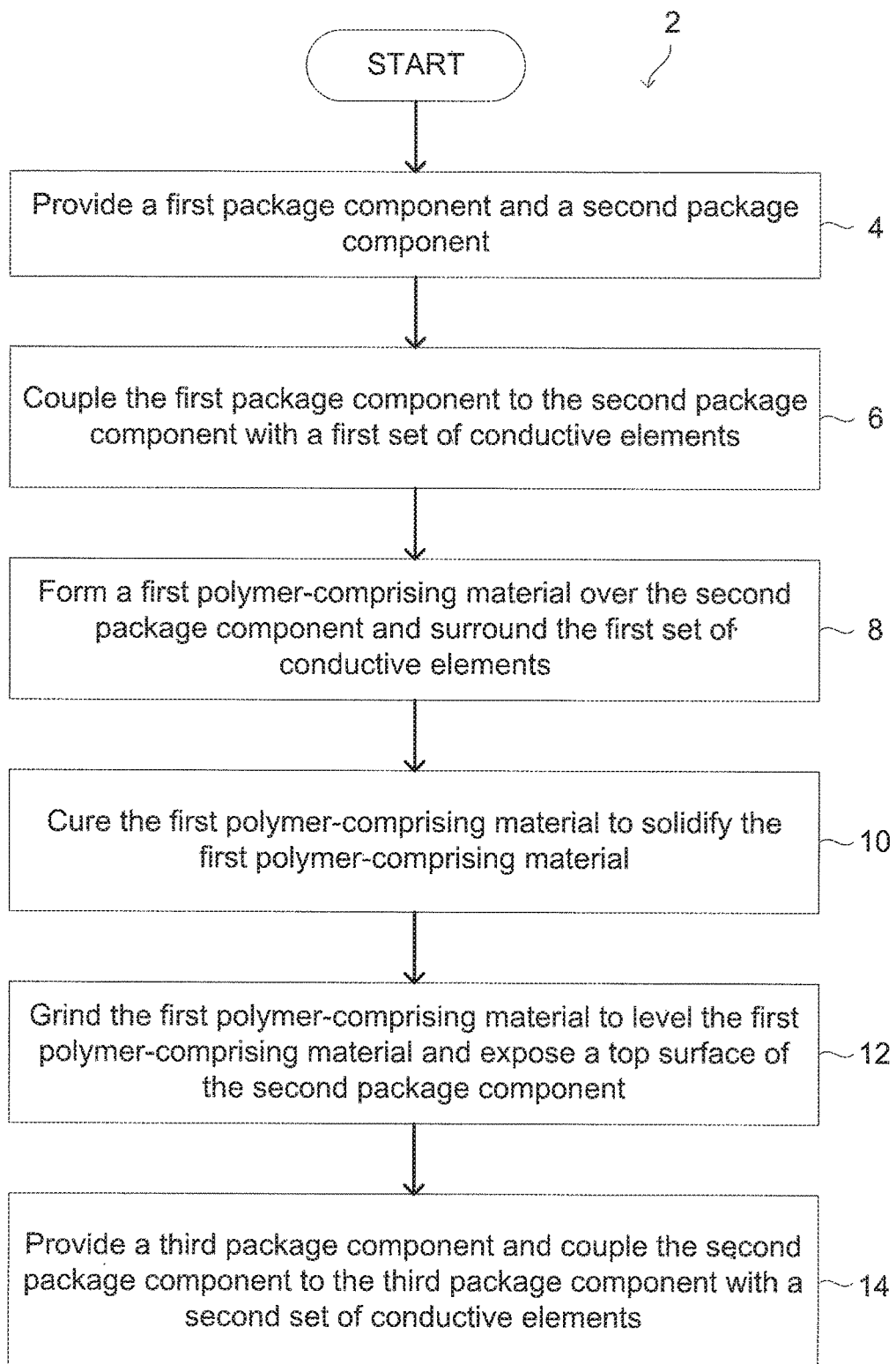
FIG. 1 is a flowchart illustrating a method for fabricating a semiconductor device according to various aspects of the present disclosure.

FIG. 1 is a flowchart of a method 2 for fabricating a semiconductor device according to various aspects of the present disclosure. Referring to FIG. 1, the method includes block 4, in which a first package component and a second package component are provided. The method 2 includes block 6, in which the first package component is coupled to the second package component using a first set of conductive elements. The method 2 includes block 8, in which a first polymer-comprising material is formed over the second package component, the first polymer-comprising material surrounds the first set of conductive elements. The method 2 includes block 10, in which the first polymer-comprising material is cured to solidify the first polymer-comprising material. The method 2 includes block 12, in which the first polymer-comprising material is ground to level the first polymer-comprising material and expose a top surface of the second package component. The method 2 includes block 14, in which a third package component is provided, and the second package component is coupled to the third package component using a second set of conductive elements.

It is understood that additional processes may be performed before, during, or after the blocks 4-14 shown in FIG. 1 to complete the fabrication of the semiconductor device, but these additional processes are not discussed herein in detail for the sake of simplicity.

FIGS. 2 through 5c are cross-sectional views of intermediate stages in the manufacture of a package-on-package structure in accordance with various embodiments of the method 2 of FIG. 1. It is understood that FIGS. 2-5c have been simplified for a better understanding of the inventive concepts of the present disclosure.

Figure 2:
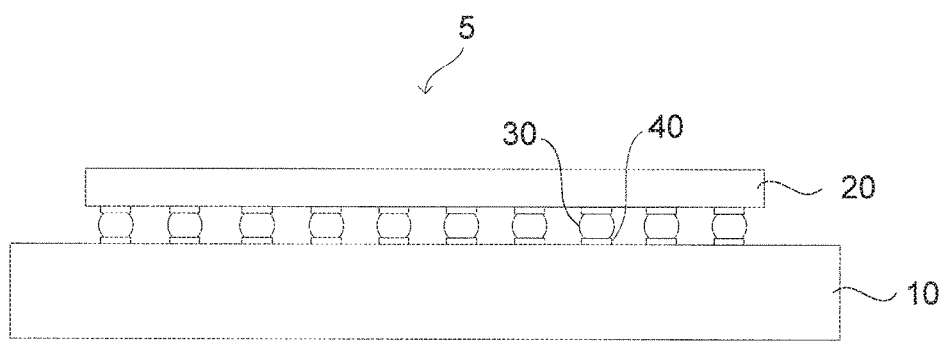
FIGS. 2 through 5C are cross-sectional views of intermediate stages in the manufacture of a package-on-package structure in accordance with various embodiments of the present disclosure.

Referring to FIG. 2, a semiconductor device 5 is provided. In at least one embodiment, semiconductor device 5 is a package-on-package structure having a first package component 10, a second package component 20, and a first set of conductive elements 30 for coupling the first package component 10 to the second package component 20. First package component 10 may be a package substrate, and hence is alternatively referred to as substrate 10 hereinafter, although it may be another type of package component that may comprise, for example a device die, an interposer, and/or other suitable package components. Substrate 10 may be formed of a semiconductor material, such as silicon, silicon germanium, silicon carbide, gallium arsenide, or other suitable semiconductor materials. Alternatively, substrate 10 may be formed of a dielectric material.

Second package component 20 may be an interposer, and hence is alternatively referred to as interposer 20 hereinafter. In some embodiments, second package component 20 may be a wafer, a device die, a substrate, and/or the like. Interposer 20 may be composed of a semiconductor material such as silicon, germanium, or gallium arsenate and in at least one embodiment may have a thickness of about 20 microns to about 500 microns. In addition to providing electrical connection between a bottom package component and a top package component and thermal conduction, interposer 20 also provides mechanical stiffening to a resulting package. In this way, interposer 20 provides stiffness and resistance to warping that might otherwise occur as a result of thermal coefficient of expansion (CTE) mismatch between the top package component and the bottom package component.

Substrate 10 is coupled to interposer 20 by the first set of conductive elements 30. First set of conductive elements 30 may be solder balls, and hence is alternatively referred to as solder balls 30 hereinafter. Solder balls 30 formed on bond pads 40 act as the electrical connectors for bonding and electrically coupling substrate 10 to interposer 20. Although solder balls 30 are illustrated in FIG. 2, connection between interposer 20 and substrate 10 could be made by way of solder bumps, copper pillars, conductive bumps, solder caps, conductive pillars, conductive balls, under-bump-metallurgies, and/or other connector elements.

Figure 3:
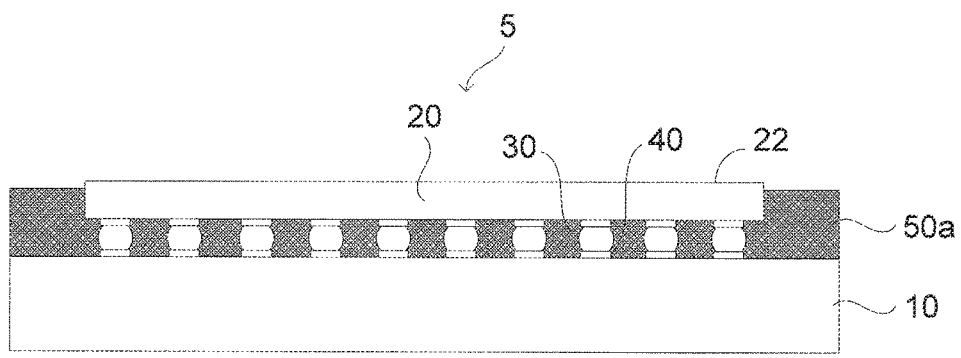

Next, as shown in FIG. 3, a first polymer-comprising material 50a is applied on the package-on-package structure shown in FIG. 2 to provide mechanical stiffness and enhance the mechanical strength of the resulting package. It is believed that this mechanical stiffness reduces the severity of warpages resulting from, e.g., thermal expansion mismatch between the components of the resulting package. In at least one exemplary embodiment, first polymer-comprising material 50a comprises a molding compound, and hence is referred to as first molding compound 50a hereinafter, although it may also be formed of other materials such as an underfill, molding underfill (MUF), epoxy, or the like. First molding compound 50a may be molded over interposer 20 and be contiguous with a top surface of substrate 10 and surround solder balls 30 using, for example, compressive molding or transfer molding to fully encapsulate interposer 20 in first molding compound 50a. A curing step is then performed to solidify first molding compound 50a. A grinding may thereafter be performed to remove portions of the first molding compound 50a that are over a top surface 22 of interposer 20. The grinding is performed to level first molding compound 50a and expose top surface 22 of interposer 20 so that another package component such as a die, for example, can be mounted onto top surface 22 of interposer 20.

Figure 4:
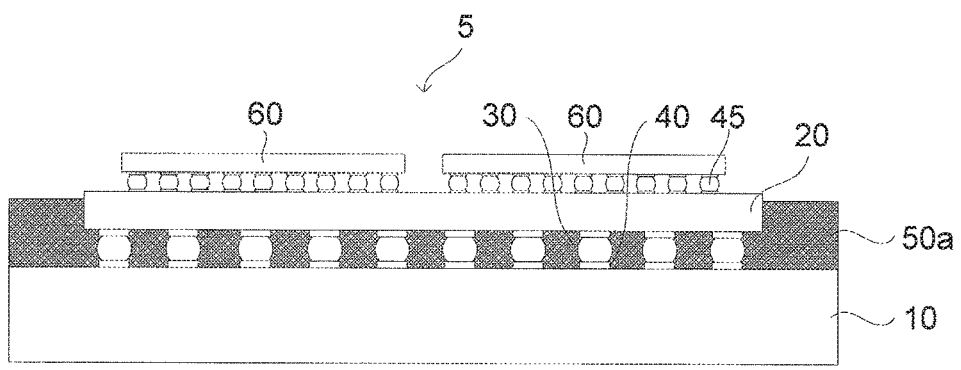

Referring now to FIG. 4, a third package component 60 is mounted onto interposer 20 using a second set of conductive elements 45. Third package component 60 may be a die, and hence is alternatively referred to as die 60 hereinafter. Die 60 may comprise a memory chip, a logic chip, a processor chip, and/or the like. Alternatively, die 60 may be a package that comprises a device die, an interposer, a package substrate, and/or the like. Although FIG. 4 illustrates two die, this is for illustration only. A plurality of dies 60, which may be identical to each other or different from each other, may be bonded to interposer 20. The bonding may be a flip-chip bonding, which is performed through second set of conductive elements 45, which provide electrical conduction of signals and power to die 60. Second set of conductive elements 45 may have various forms. In some embodiments, second set of conductive elements 45 are solder bumps. In alternative embodiments, second set of conductive elements 45 may include solder balls, conductive bumps, copper pillars, conductive pillars, conductive balls, solder caps, under-bump-metallurgies, and/or other connector elements.

As was shown in FIG. 3, first molding compound 50a was applied on the package-on-package structure of FIG. 2 to enhance the mechanical strength and stiffness of the package-on-package structure. In FIG. 5b, an underfill 70 is dispensed into a gap between interposer 20 and die 60 to reinforce the strength of second set of conductive elements 45 and therefore the overall package-on-package structure 5. After the dispensing, underfill 70 is cured. To further enhance the package of FIG. 5b and control the warpage, in at least one embodiment, underfill 70 is dispensed into a gap between substrate 10 and interposer 20 to surround the first set of conductive elements 30. The underfill 70 reinforces the strength of the first set of conductive elements 30 whilst providing for a high thermal conductivity.

Figure 5A:
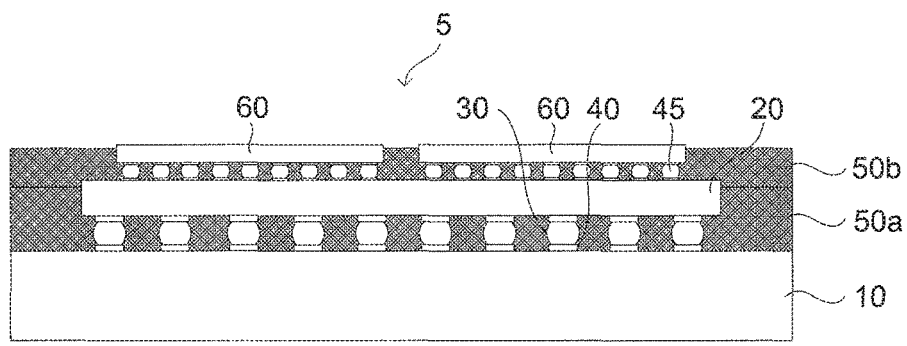
Figure 5B:
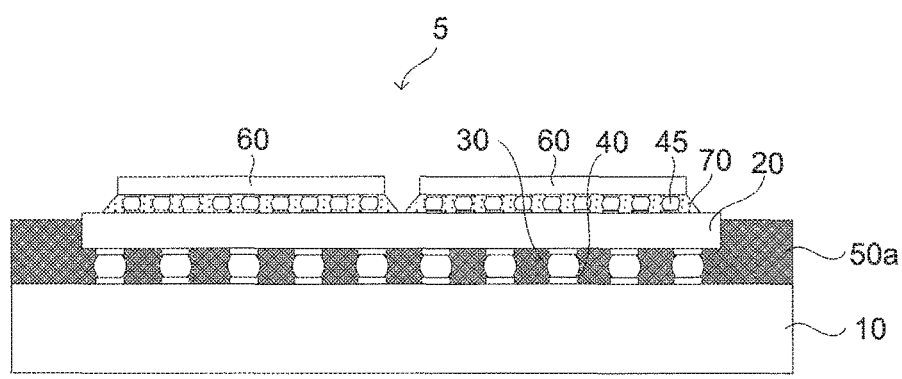

In another embodiment of the present disclosure, a second polymer-comprising material 50b is applied on the package-on-package structure shown in FIG. 4-5a to provide mechanical stiffness and enhance the mechanical strength of the resulting package. It is believed that this mechanical stiffness reduces the severity of warpages resulting from, e.g., thermal expansion mismatch between the components of the resulting package. In an exemplary embodiment, second polymer-comprising material 50b comprises a molding compound, and hence is referred to as second molding compound 50b hereinafter, although it may also be formed of other materials such as an underfill, molding underfill (MUF), epoxy, or the like. Second molding compound 50b may be molded over die 60 and be contiguous with a top surface of interposer 20 and surround second set of conductive elements 45 using, for example, compressive molding or transfer molding to fully encapsulate die 60 in second molding compound 50b. A curing step is then performed to solidify second molding compound 50b. A grinding may thereafter be performed to remove portions of the second molding compound 50b that are over a top surface of die 60. The grinding is performed to level second molding compound 50b and expose a top surface of die 60. The resulting structure is shown in FIG. 5a.

To further enhance the package-on-package structure 5 of FIG. 5a and control the warpage, in at least one embodiment, underfill 70 is dispensed into the gap between substrate 10 and interposer 20 to reinforce the strength of the first set of conductive elements 30 whilst providing for a high thermal conductivity.

Figure 5C:
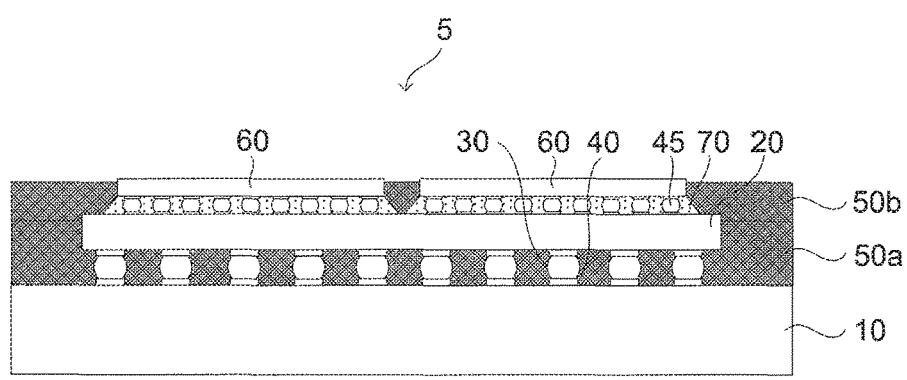

In at least one embodiment as shown in FIG. 5c, to further enhance the package-on-package structure 5 of FIG. 5a and control the warpage, underfill 70 is dispensed into the gap between interposer 20 and die 60 to reinforce the strength of second set of conductive elements 45 and the resulting package. After the dispensing, underfill 70 is cured. In at least one embodiment, to further strengthen the package structure 5 of FIG. 5c and control the warpage, underfill 70 is dispensed into the gap between substrate 10 and interposer 20 to reinforce the strength of the first set of conductive elements 30.

Advantages of one or more embodiments of the present disclosure may include one or more of the following.

In one or more embodiments, a package-on-package structure provides for improved mechanical strength and mechanical stiffness by the introduction of a molding compound in the package-on-package structure. It is believed that this mechanical stiffness reduces the severity of warpages resulting from, e.g., thermal expansion mismatch between the components of the resulting package.

In one or more embodiments, a package-on-package structure provides for improved warpage control by the introduction of a molding compound in the package-on-package structure.

In one or more embodiments, the manufacturing costs are reduced for manufacturing a package-on-package structure having improved mechanical strength and warpage control.

The present disclosure has described various exemplary embodiments. According to one embodiment, the present disclosure relates to a package-on-package structure comprising a first set of conductive elements coupling a first package component to a second package component. A first molding material is arranged on the first package component. The first molding material surrounds the first set of conductive elements and outer sidewalls of the second package component and has a top surface below a top surface of the second package component. The stacked integrated chip structure further comprises a second set of conductive elements that couples the second package component to a third package component.

According to another embodiment, the present disclosure relates to a package-on-package structure comprising a first package component coupled to a second package component by a first set of conductive elements. A first molding material is arranged between the first package component and the second package component and surrounds the first set of conductive elements and the second package component. A third package component is coupled to the second package component by a second set of conductive elements. An underfill is arranged on the second package component and surrounds the second set of conductive elements. The underfill has a bottom surface that is above a top surface of the first molding material.

According to yet another embodiment, the present disclosure relates to a package-on-package structure comprising a first package component and a second package component. A first set of conductive elements couples the first package component to the second package component. A first molding material is arranged on the first package component. The first molding material surrounds the first set of conductive elements. The stacked integrated chip structure further comprises a third package component. A second set of conductive elements couples the second package component to the third package component. A second molding material is arranged on the second package component and a top surface of the first molding material. The second molding material has a top surface that is below a top surface of the third package component.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A package-on-package structure, comprising:
a first set of conductive elements coupling a first package component to a second package component;
a first molding material arranged on an upper surface of the first package component and surrounding the first set of conductive elements and outer sidewalls of the second package component, wherein the first molding material has a topmost surface below a top surface of the second package component and wherein the topmost surface of the first molding material comprises a leveled topmost surface that is parallel to the upper surface of the first package component; and
a second set of conductive elements coupling the second package component to a third package component.

2. The structure of claim 1, wherein the first molding material directly contacts the upper surface of the first package component, a lower surface of the second package component, and the outer sidewalls of the second package component.

3. The structure of claim 1, wherein the first molding material directly contacts the outer sidewalls of the second package component.

4. The structure of claim 1, further comprising:
an underfill surrounding the second set of conductive elements, wherein the topmost surface of the first molding material is below a bottom surface of the underfill.

5. The structure of claim 1, wherein the first set of conductive elements comprise conductive pillars, conductive balls, solder caps, or under-bump-metallurgies.

6. The structure of claim 1, further comprising:
a second molding material arranged on the second package component and directly contacting the topmost surface of the first molding material, wherein the second molding material has a topmost surface below a topmost surface of the third package component.

7. The structure of claim 1, further comprising:
a second molding material arranged directly over the topmost surface of the first molding material and having a topmost surface comprising a leveled topmost surface, wherein the second molding material has sidewalls contacting the outer sidewalls of the second package component and the third package component.

8. The structure of claim 1, wherein the first molding material comprises an underfill, a molding underfill (MUF), or an epoxy.

9. A package-on-package structure, comprising:
a first package component coupled to a second package component by a first set of conductive elements;
a first molding material arranged between an upper surface of the first package component and a lower surface of the second package component and surrounding the first set of conductive elements and the second package component;
a third package component coupled to the second package component by a second set of conductive elements;
an underfill arranged on an upper surface of the second package component and surrounding the second set of conductive elements, wherein the underfill has a bottom surface that is above a topmost surface of the first molding material; and
a second molding material arranged on the upper surface of the second package component and directly contacting sidewalls of the second package component.

10. The structure of claim 9, further comprising:
a fourth package component coupled to the second package component by a third set of conductive elements, wherein the underfill is arranged over the second package component at a location laterally between the third package component and the fourth package component.

11. The structure of claim 10, wherein the second package component laterally extends past outer sidewalls of the third package component and the fourth package component.

12. The structure of claim 9, wherein the topmost surface of the first molding material comprises a leveled topmost surface.

13. The structure of claim 9, wherein the second molding material directly contacts sidewalls of the underfill.

14. The structure of claim 9, wherein the first molding material directly contacts sidewalls of the second package component.

15. A package-on-package structure, comprising:
a first package component;
a second package component;
a first set of conductive elements coupling the first package component to the second package component;

a first molding material arranged on an upper surface of the first package component, the first molding material surrounding the first set of conductive elements and the second package component;

a third package component;

a second set of conductive elements coupling the second package component to the third package component; and a second molding material arranged on the second package component, wherein the second molding material has a lower surface that vertically and directly contacts a topmost surface of the first molding material at a location laterally outside of the third package component.

16. The structure of claim 15, wherein a line perpendicular to the upper surface of the first package component extends through the location laterally outside of the third package component.

17. The structure of claim 15, wherein the second molding material directly contacts an upper surface of the second package component, a lower surface of the third package component, and sidewalls of the second package component and the third package component.

18. The structure of claim 15, wherein one or more of the first molding material and the second molding material completely cover outermost sidewalls of the second package component that extend in a direction perpendicular to the upper surface of the first package component.

19. The structure of claim 15, further comprising:

an underfill surrounding the second set of conductive elements, wherein the second molding material has a bottom surface that is vertically offset from a bottom surface of the underfill by a non-zero distance.

20. The structure of claim 15, further comprising:

an underfill surrounding the second set of conductive elements, wherein the second molding material has a bottom surface that is below a bottom surface of the underfill.

* * * * *